United States Patent
Park et al.

(10) Patent No.: US 9,992,433 B2
(45) Date of Patent: Jun. 5, 2018

(54) IMAGE PROCESSING APPARATUS AND CONTROL METHOD THEREOF

(71) Applicant: ELECTRONICS AND TELECOMMUNICATIONS RESEARCH INSTITUTE, Daejeon (KR)

(72) Inventors: Sun Tak Park, Incheon (KR); Ki-Uk Kyung, Daejeon (KR); Sae Kwang Nam, Daejeon (KR); Bong Je Park, Daejeon (KR); Seung Koo Park, Daejeon (KR); Sung Ryul Yun, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 35 days.

(21) Appl. No.: 15/164,500

(22) Filed: May 25, 2016

(65) Prior Publication Data

US 2017/0054929 A1    Feb. 23, 2017

(30) Foreign Application Priority Data

Aug. 21, 2015  (KR) ................. 10-2015-0118201
Mar. 18, 2016  (KR) ................. 10-2016-0032671

(51) Int. Cl.
*H04N 5/369*    (2011.01)
*H01L 27/146*   (2006.01)
*H04N 5/232*    (2006.01)

(52) U.S. Cl.
CPC ......... *H04N 5/3696* (2013.01); *H01L 27/146* (2013.01); *H01L 27/14607* (2013.01); *H04N 5/23212* (2013.01)

(58) Field of Classification Search
CPC ............. H04N 5/3696; H04N 5/23212; H01L 27/14607; H01L 27/146
See application file for complete search history.

(56) References Cited

U.S. PATENT DOCUMENTS

| | | | |
|---|---|---|---|
| 6,464,363 B1 * | 10/2002 | Nishioka | G02B 7/102 359/224.1 |
| 7,297,926 B2 | 11/2007 | Kaluzhny | |
| 8,654,177 B2 | 2/2014 | Kim et al. | |
| 2005/0030408 A1 * | 2/2005 | Ito | H04N 5/2253 348/340 |
| 2008/0304821 A1 | 12/2008 | Jeung et al. | |
| 2015/0205096 A1 | 7/2015 | Nam et al. | |
| 2015/0234153 A1 | 8/2015 | Park et al. | |

FOREIGN PATENT DOCUMENTS

| | | |
|---|---|---|
| KR | 10-0860308 B1 | 9/2008 |
| KR | 10-1016898 B1 | 2/2011 |
| KR | 10-1445185 B1 | 9/2014 |

* cited by examiner

*Primary Examiner* — Albert Cutler

(57) ABSTRACT

There are provided an image processing apparatus and a control method thereof. An image processing apparatus includes an image sensor for acquiring a target image, an image processing module for performing focusing on a specific area of the acquired target image and determining a focal surface of the target image on the basis of the performed focusing, and a drive control module for controlling the curvature of the image sensor, based on the determined focal surface.

18 Claims, 5 Drawing Sheets

IMAGE PROCESSING APPARATUS AND CONTROL METHOD THEREOF

CROSS-REFERENCE TO RELATED APPLICATION

The present application claims priority to Korean Patent Application Numbers 10-2015-0118201 filed on Aug. 21, 2015 and 10-2016-0032671 filed on Mar. 18, 2016, in the Korean Intellectual Property Office, the entire disclosure of which is incorporated by reference herein.

BACKGROUND

1. Field

An aspect of the present disclosure relates to an image processing apparatus and a control method thereof.

2. Description of the Related Art

Recently, as portable terminals such as smart phones are widely spread, compact, high-resolution cameras have been continuously developed. An image system used in most cameras includes a lens system and an image sensor, i.e., a CCD or CMOS device, for storing beam intensity information. The image sensor has a planar form configured with a plurality of optical sensor arrays. The image sensor is also referred to as an image pick device. A camera lens system according to a related art uses a plurality of lenses so as to obtain a high-resolution image, which is a method for reducing aberration.

In general, the degree of aberration is greater at an edge of an image sensor than at the center of the image sensor, which results in distortion of an image. FIG. 1 is an exemplary view illustrating an imaging system including a single lens and a planar image sensor according to a related art.

Referring to FIG. 1, beams incident onto a lens 100 in parallel to an optical axis are accurately focused on a surface of an image sensor 110. However, beams incident onto the lens 100 not in parallel to the optical axis may be focused at a front portion of the image sensor 110. If points forming focuses with respect to all beams incident onto the lens 100 while forming a certain angle with the optical axis are connected, an optimum focal surface 120 may be formed. According to the related art, a clear image can be obtained at a central portion of the image sensor 110, but the image is blurred at an edge portion of the image sensor 110 due to aberration. In order to solve the aberration, in the imaging system according to the related art, a plurality of lenses are used, or a device capable of compensating for aberration is inserted between the lens and the image sensor. However, in the related art, the structure of the imaging system is complicated, and the size of the image system is increased. In addition, manufacturing cost is increased.

SUMMARY

Embodiments provide an image processing apparatus in which the curvature of an image sensor is adaptively changed to correspond to a focal surface of a target image, thereby minimizing aberration.

Embodiments also provide a control method of an image processing apparatus, in which the curvature of an image sensor is adaptively changed to correspond to a focal surface of a target image, thereby minimizing aberration.

According to an aspect of the present disclosure, there is provided an image processing apparatus including: an image sensor configured to acquire a target image; an image processing module configured to perform focusing on a specific area of the acquired target image and determine a focal surface of the target image on the basis of the performed focusing; and a drive control module configured to control the curvature of the image sensor, based on the determined focal surface.

According to an aspect of the present disclosure, there is provided a method of controlling an image processing apparatus, the method including: acquiring a target image; performing focusing on a specific area of the acquired target image; determining a focal surface of the target image on the basis of the performed focusing; and controlling the curvature of an image sensor, based on the determined focal surface.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Hereinafter, various exemplary embodiments of the present disclosure will be described in detail with reference to the drawings. However, it should be understood that various exemplary embodiments of the present disclosure are not limited to a specific exemplary embodiment, but include various modifications, equivalents and/or alternatives of various exemplary embodiments. The same reference numbers are used throughout the drawings to refer to the same or like parts.

In the present disclosure, an expression such as "having," "may have," "including," or "may include" indicates existence of a corresponding characteristic (such as an element such as a numerical value, function, operation, or component) and does not exclude existence of additional characteristic.

In the present disclosure, an expression such as "A or B," "at least one of A or/and B," or "one or more of A or/and B" may include all possible combinations of together listed items. For example, "A or B," "at least one of A and B," or "one or more of A or B" may indicate the entire of (1) a case of including at least one A, (2) a case of including at least one B, or (3) a case of including both at least one A and at least one B.

Expressions such as "first," "second," "primarily," or "secondary" used in various exemplary embodiments may represent various elements regardless of order and/or importance and do not limit corresponding elements. The expression may be used for distinguishing one element from another element. For example, a first user device and a second user device may represent different user devices regardless of order or importance. For example, a first element may be referred to as a second element without deviating from the scope of the present disclosure, and similarly, a second element may be referred to as a first element.

Terms used in the present disclosure are used for only describing a specific exemplary embodiment and may not have an intention to limit the scope of other exemplary embodiments. In the present disclosure and the appended claims, a singular form may include a plurality of forms unless it is explicitly differently represented. Unless differently defined, entire terms including a technical term and a scientific term used here may have the same meaning as a meaning that may be generally understood by a person of common skill in the art. It may be analyzed that generally using terms defined in a dictionary have the same meaning or a meaning similar to that of a context of related technology and are not analyzed as an ideal or excessively formal meaning unless explicitly defined in the present disclosure. In some case, terms defined in the present disclosure cannot be analyzed to exclude exemplary embodiments of the present disclosure.

Hereinafter, image processing apparatuses according to various embodiments of the present disclosure and a control method thereof will be described with reference to the accompanying drawings.

Figure 2:
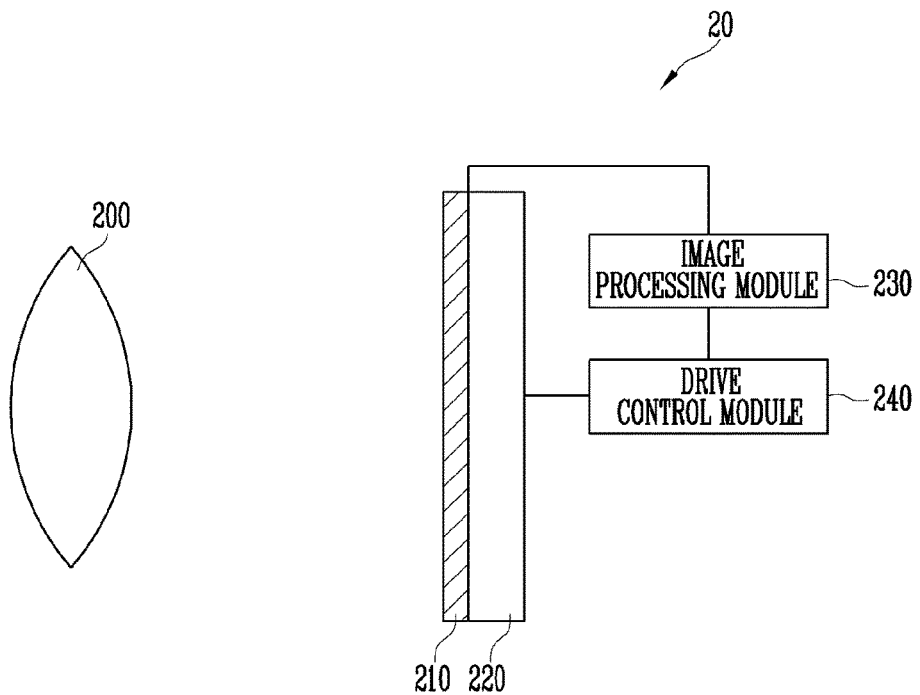
FIG. 2 is an exemplary view illustrating image processing apparatuses according to various embodiments of the present disclosure.

FIG. 2 is an exemplary view illustrating image processing apparatuses according to various embodiments of the present disclosure.

Among the image processing apparatuses according to the various embodiments of the present disclosure, an image processing apparatus 20 may include a lens 200, an image sensor 210, a drive unit 220, an image processing module 230, and a drive control module 240.

The lens 200 may include various types of lenses including a spherical lens, an aspheric lens, a variable lens such as a liquid lens capable of changing the shape or focus thereof, and the like. In FIG. 2, only one lens is illustrated as an example, but the lens 200 may include a plurality of lenses. In this case, the plurality of lenses may form a lens group. The image processing apparatus 20 may include a device (not shown) that enables movement of one ore more lenses 200 or lens groups. An actuator for moving the lens or lens group may include a voice coil motor, a piezo motor, a step motor, and the like.

The image sensor 210 may include a flexible, bendable, or foldable image pickup device. For example, the image sensor 210 may include a bendable CCD, a semiconductor optical sensor array such as CMOS, or a flexible nano photoelectric device array. Alternatively, the image sensor 210 may include an optical sensor array based on a two-dimensional nanoplate chalcogen compound, graphene, or carbon nanotube, which can be formed on a flexible substrate. The image sensor 210 may include an array configured with pixels, i.e., photo sensors or photo transistors. For example, the pixels may be formed at a distance of 10 μm or less or a distance of a few tens of μm.

The drive control module 240 capable of changing the curvature of the image sensor 210 may control the drive unit 220 using the pressure of a gas or fluid or on the basis of a physical or electromagnetic method. According to the various embodiments of the present disclosure, the drive control module 240 may perform, for example, a function/operation of a linear driver capable of adjusting not only the curvature of the image sensor 210 but also the distance between the lens 200 and the image sensor 210.

The drive unit 220 may be formed on the image sensor 210 to change the curvature of the image sensor 210. A structure of the drive unit 220 will be described later.

Figure 1:
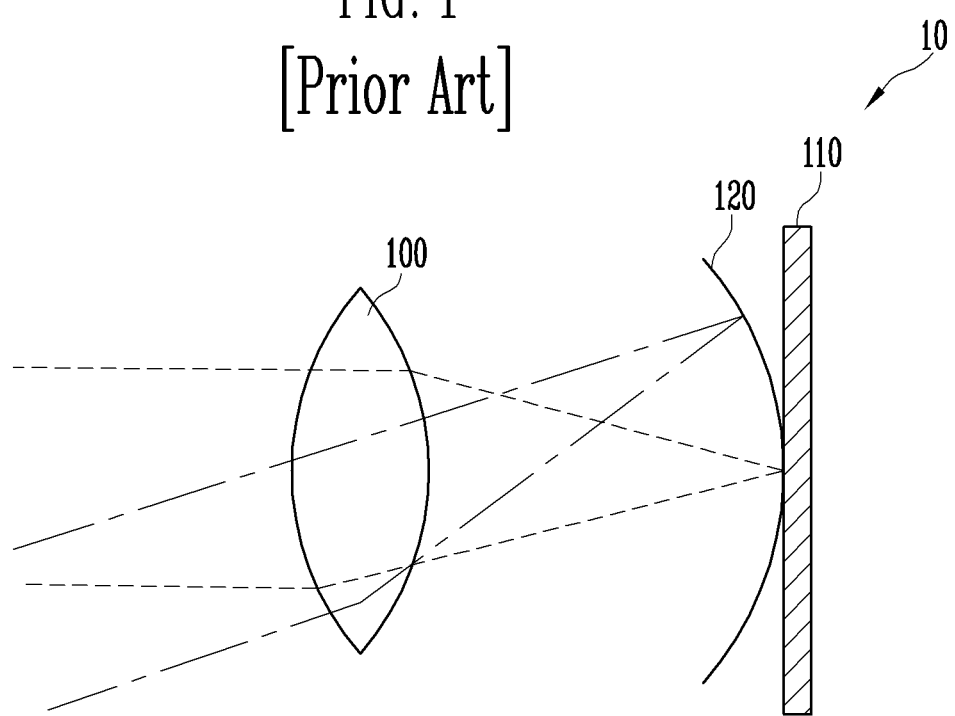
FIG. 1 is an exemplary view illustrating an imaging system including a single lens and a planar image sensor according to a related art.

The image processing module 230 may perform a focusing function/operation on at least one area of a target image. The focusing function/operation may refer to a function/operation of focusing at least one area of the target image. In this specification, the term "at least one area of the target image" may be replaced with the term "standard image." After the focusing function/operation is performed on the standard image, the image processing module 230 may determine a focal surface of the target image. Like the focal surface 120 described in FIG. 1, for example, the focal surface may refer to an optimum focal surface of the target image.

According to the various embodiments of the present disclosure, an auto focusing algorithm according to a related art may be identically applied to the focusing function/operation and the function/operation of determining the focal surface.

The drive control module 240 may be electrically connected to the drive unit 220. As described above, the drive control module 240 may control the drive unit 220 using the pressure of the gas or fluid or on the basis of the physical or electromagnetic method.

In FIG. 2, it is illustrated that the image processing module 230 and the drive control module 240 are provided as separate components, but this is merely an embodiment for convenience of illustration. According to the various embodiments of the present disclosure, the image processing module 230 and the drive control module 240 may be integrated as one module (e.g., a control module such as a processor).

Figure 3A:
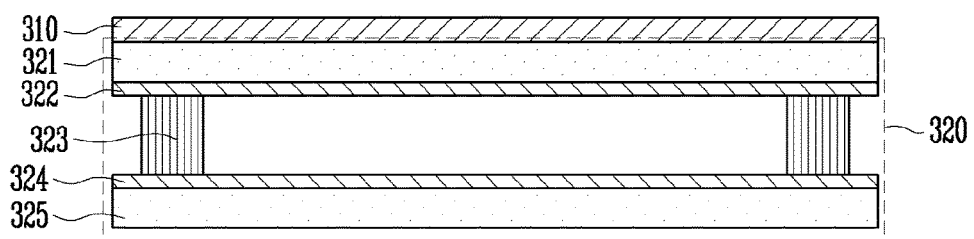
FIGS. 3A and 3B are exemplary views illustrating drive units according to various embodiments of the present disclosure.
Figure 3B:
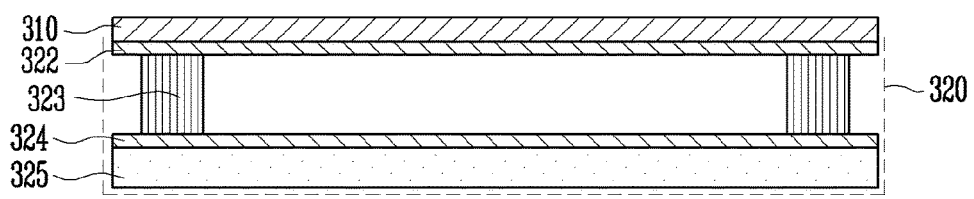

FIGS. 3A and 3B are exemplary views illustrating drive units according to various embodiments of the present disclosure.

Referring to FIG. 3A, among the drive units according to the various embodiments of the present disclosure, a drive unit 320 may include an upper substrate 321 formed adjacent to an image sensor 310, an upper electrode 322 formed adjacent to the upper substrate 321, a spacer 323, a lower electrode 324, and a lower substrate 325. In FIG. 3A, there is exemplarily illustrated the drive unit 320 that is driven by an electric force between the upper and lower electrodes 322 and 324.

According to the various embodiments of the present disclosure, the upper substrate 321 may be attached to the image sensor 310. The upper substrate 321 may include various types of substrate such as flexible, bendable, and foldable substrates. The lower substrate 325 may be made of a hard material such as glass or polymer. Similarly, the upper electrode 322 may include a flexible, bendable, or foldable electrode made of a material that can be warped, and the lower electrode 324 may be made of a hard material.

The spacer 323 may provide a space in which the image sensor 310 can be warped by the electric force between the upper and lower electrodes 322 and 324. Also, the spacer 323 may provide a space capable of preventing the upper and lower electrodes 322 and 324 from being contacted with each other by the electric force. According to the various embodiments of the present disclosure, the spacer 323 may include a protective layer (i.e., an insulative layer) for preventing the contact between the upper and lower electrodes 322 and 324.

Referring to FIG. 3B, among the drive units according to the various embodiments of the present disclosure, a drive unit 320 may be manufactured in a state in which the upper substrate 321 is omitted. In this case, the upper electrode 322 is directly connected to the image sensor 310, so that the curvature of the image sensor 310 can be more largely changed even with the same voltage, as compared with the drive unit 320 shown in FIG. 3A. Further, the structure of the drive unit 320 can be simplified.

Figure 4A:
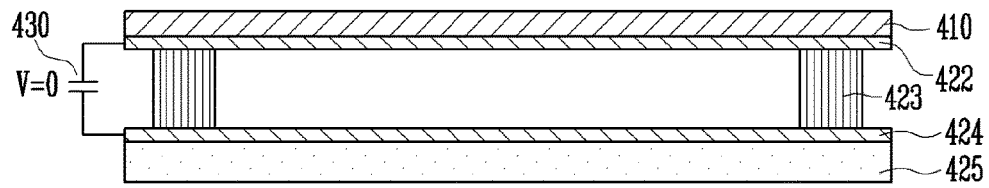
FIGS. 4A and 4B are exemplary views illustrating a driving principle of image processing apparatuses according to various embodiments of the present disclosure.
Figure 4B:
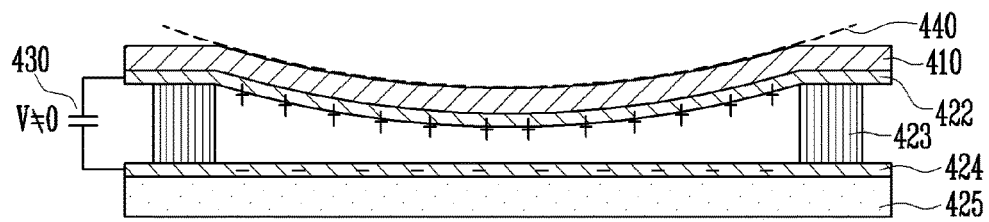

FIGS. 4A and 4B are exemplary views illustrating a driving principle of image processing apparatuses according to various embodiments of the present disclosure.

Referring to FIG. 4A, among the image processing apparatuses according to the various embodiments of the present disclosure, an image processing apparatus may include an upper electrode 422 formed adjacent to an image sensor 410, a spacer 423, a lower electrode 424, and a lower substrate 425. At least one power source 430 is connected to the upper and lower electrodes 422 and 424 such that a voltage can be applied to the upper and lower electrodes 422 and 424. In FIG. 4A, there is illustrated a state in which any voltage is not applied to the upper and lower electrodes 422 and 424.

Figure 6:
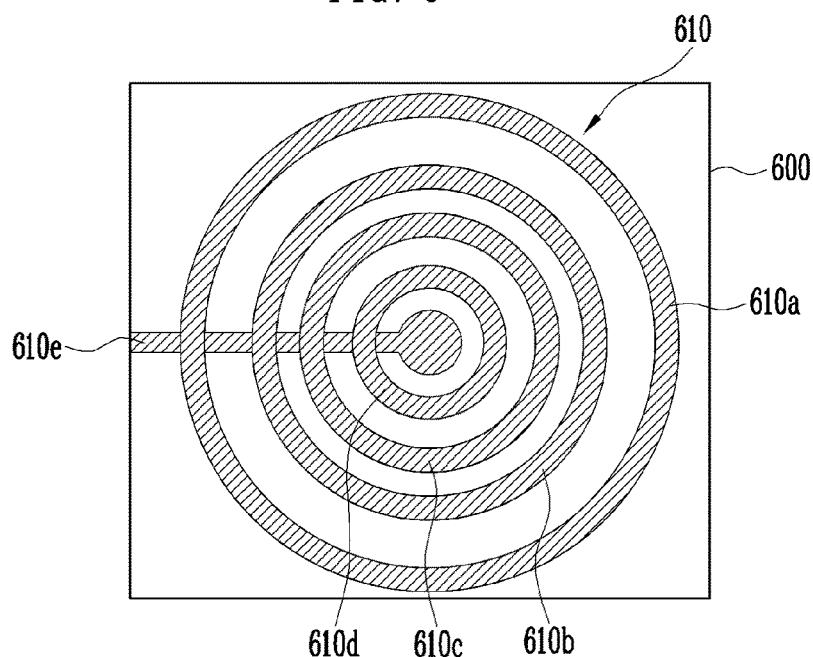
FIG. 6 is an exemplary view illustrating electrode patterns according to various embodiments of the present disclosure.

Referring to FIG. 4B, if a focal surface 440 is determined by an image processing module (e.g., the image processing module 230), a drive control module (e.g., the drive control module 240) may apply a voltage to the upper and lower electrodes 422 and 424 through the power source 430 so as to change the curvature of the image sensor 410, corresponding to the determined focal surface 440. According to the various embodiments of the present disclosure, the power source 430 may be provided in plurality so as to change the curvature of the image sensor 410. For example, the plurality of power sources 430 may be respectively connected to electrode pattern elements 610a, 610b, 610c, 610d, and 610e constituting an electrode pattern 610 shown in FIG. 6, and the same voltage or different voltages may be applied to the electrode pattern elements 610a, 610b, 610c, 610d, and 610e through the power sources 430 respectively connected thereto. According to the various embodiments of the present disclosure, the electrode pattern elements 610a, 610b, 610c, 610d, and 610e may be formed to be electrically connected to each other or to be isolated from each other.

According to the various embodiments of the present disclosure, the power source 430 may include a power source capable of providing not only a fixed voltage but also a variable voltage. The power source 430 may include at least one of a DC power source and an AC power source. Also, the power source 430 may include a capacitor capable of charging electric charges. The drive control module may apply voltages having different intensities to the respective electrode pattern elements 610a, 610b, 610c, 610d, and 610e so as to form the curvature of the image sensor 410, corresponding to the focal surface 440. Like the shape of the image sensor 410 shown in FIG. 4B, the curvature of a specific portion of the image sensor 410 may be variously determined based on the intensities of the applied voltages. For example, the portion at which the intensity of the voltage is strongest may serve as a portion having a large curvature as an attractive force acts between the upper and lower electrode 422 and 424.

Figure 5A:
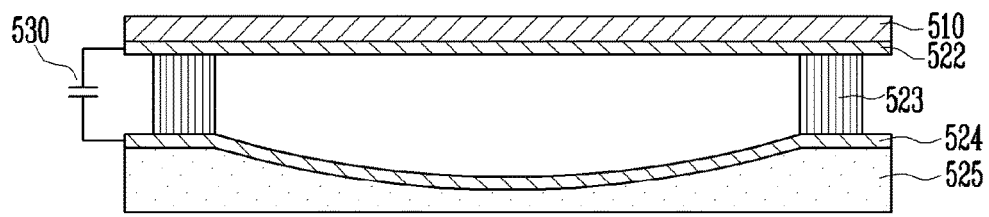
FIGS. 5A and 5B are exemplary views illustrating examples of lower substrates according to various embodiments of the present disclosure.
Figure 5B:
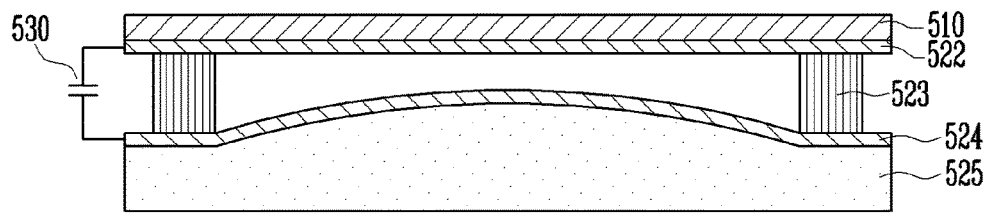

FIGS. 5A and 5B are exemplary views illustrating examples of lower substrates according to various embodiments of the present disclosure. Referring to FIGS. 5A and 5B, among the lower substrates according to the various embodiments of the present disclosure, a lower substrate 525 may be formed in a concave or convex shape.

Figure 7:
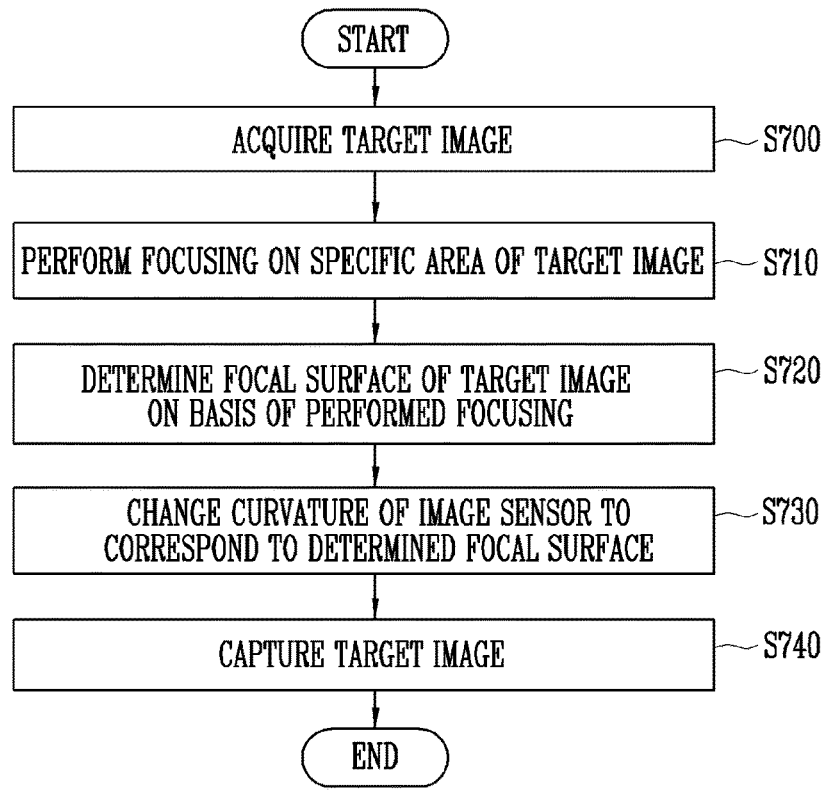
FIG. 7 is an exemplary view illustrating control methods of image processing apparatuses according to various embodiments of the present disclosure.

FIG. 7 is an exemplary view illustrating control methods of image processing apparatuses according to various embodiments of the present disclosure.

Referring to FIG. 7, among the control methods according to the various embodiments of the present disclosure, a control method of an image processing apparatus may include a process of acquiring a target image (S700) and a process of performing focusing on a specific area of the target image (S710).

According to the various embodiments of the present disclosure, the control method may include a process of determining a focal surface of the target image on the basis of the performed focusing (S720).

According to the various embodiments of the present disclosure, the control method may include a process of changing the curvature of an image sensor to correspond to the determined focal surface (S730).

According to the various embodiments of the present disclosure, the control method may include a process of capturing the target image in the state in which the curvature of the image sensor is changed (S740).

In addition, descriptions of the above-described image processing apparatuses may be identically applied to the control methods according to the various embodiments of the present disclosure.

Figure 8A:
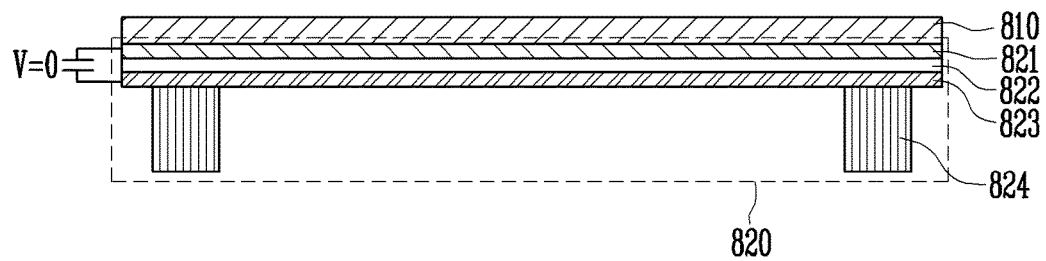
FIGS. 8A and 8B are other exemplary views illustrating drive units according to various embodiments of the present disclosure.
Figure 8B:
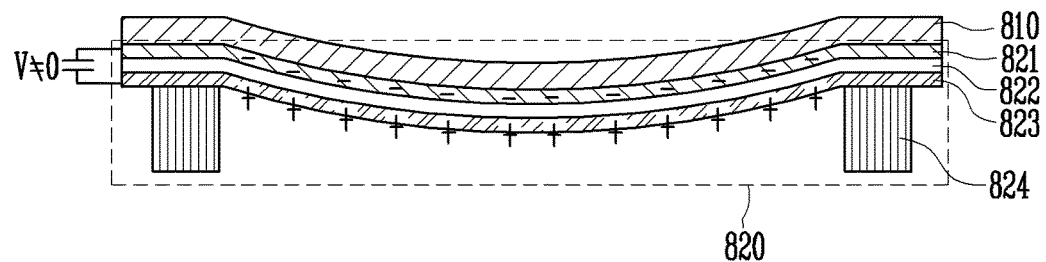

FIGS. 8A and 8B are other exemplary views illustrating drive units according to various embodiments of the present disclosure.

Referring to FIG. 8A, among the drive units according to the various embodiments of the present disclosure, a drive unit 820 may include an upper electrode 821 formed adjacent to an image sensor 810, an active variable material 822 formed adjacent to the upper electrode 821, a lower electrode 823, and a support structure 824. In FIG. 8A, there is exemplarily illustrated the drive unit 820 in which, if a voltage is applied between the upper and lower electrodes 821 and 823, the active variable material 822 expands in a direction perpendicular to the direction in which the voltage is applied, i.e., a horizontal direction of the drive unit 820. At this time, the support structure 824 is formed in the drive unit 820 such that the active variable material 822 does not expand in the horizontal direction, so that the curved surface of the image sensor 810 can be adjusted using the principle that the entire drive unit 820 is warped downward as shown in FIG. 8B.

According to the various embodiments of the present disclosure, the active variable material 822 may include all materials of which volume is changed when a voltage is applied, including electroactive polymer.

According to the present disclosure, the curvature of an image sensor is adaptively changed to correspond to a focal surface of a target image, thereby minimizing aberration.

The term "module" as used in various embodiments of the present disclosure may mean, for example, a unit including one of hardware, software, and firmware or any combination of two or more of them. The "module" may be interchangeably used with, for example, the term "unit," "logic," "logical block," "component," or "circuit." The "module" may be the smallest unit of an integrated component or a part thereof. The "module" may be the smallest unit that performs one or more functions or a part thereof. The "module" may be mechanically or electronically implemented. For example, the "module" according to various embodiments of the present disclosure may include at least one of an Application-Specific IC (ASIC) chip, a Field-Programmable Fate Array (FPGA), and a programmable-logic device for performing certain operations, which are now known or will be developed in the future.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. An image processing apparatus comprising:
   an image sensor configured to acquire a target image;
   an image processing circuit configured to perform focusing on a specific area of the acquired target image and to determine a focal surface of the target image on the basis of the performed focusing; and
   a drive control circuit including an upper electrode, a lower substrate, and a lower electrode disposed on the lower substrate and spaced apart from the upper electrode, the upper electrode including a plurality of electrode patterns attached to the image sensor that are electrically isolated from each other, the drive control module being configured to control the curvature of the image sensor, based on the determined focal surface, by applying a voltage to the upper and lower electrodes.

2. The image processing apparatus of claim 1, wherein the drive control circuit includes:
   an upper substrate,
   the upper electrode being disposed on the upper substrate,
   the lower electrode being disposed on the lower substrate; and
   a spacer disposed between the upper and lower electrodes.

3. The image processing apparatus of claim 1, wherein the drive control circuit includes:
   a spacer disposed between the upper and lower electrodes.

4. The image processing apparatus of claim 3, wherein the lower substrate is one or more of a flat type, a concave type, and a convex type.

5. The image processing apparatus of claim 1, wherein the image sensor includes a flexible or bendable image sensor.

6. The image processing apparatus of claim 1, wherein the drive control circuit includes:
   a support structure,
   the lower electrode being disposed on the support structure; and
   an active variable material disposed between the upper and lower electrodes.

7. The image processing apparatus of claim 6, wherein the active variable material includes an arbitrary material that, if a voltage is applied between the upper and lower electrodes, expands in a direction perpendicular to the direction in which the voltage is applied.

8. The image processing apparatus of claim 1, wherein the plurality of electrode patterns includes a plurality of concentric ring patterns disposed on an upper substrate.

9. The image processing apparatus of claim 1, wherein the drive control circuit is configured to bend the image sensor by applying a plurality of different voltages to the plurality of electrode patterns, respectively.

10. A method of controlling an image processing apparatus, the method comprising:
    acquiring a target image using an image sensor;
    performing focusing on a specific area of the acquired target image;
    determining a focal surface of the target image on the basis of the performed focusing; and
    controlling the curvature of an image sensor, based on the determined focal surface, by applying a voltage to an upper electrode and a lower electrode, the upper electrode including a plurality of electrode patterns fixed to the image sensor that are electrically isolated from each other.

11. The method of claim 10, wherein the upper electrode is disposed on an upper substrate,
    wherein the lower electrode is disposed on a lower substrate, and
    wherein a spacer is disposed between the upper and lower electrodes.

12. The method of claim 10, wherein
    the lower electrode is disposed on a lower substrate, and
    wherein a spacer is disposed between the upper and lower electrodes.

13. The method of claim 12, wherein the lower substrate is one or more of a flat type, a concave type, and a convex type.

14. The method of claim 10, wherein the image sensor includes a flexible or bendable image sensor.

15. The method of claim 10, wherein the lower electrode is disposed on a support structure; and
    an active variable material is disposed between the upper and lower electrodes.

16. The method of claim 15, wherein the active variable material includes an arbitrary material that, if a voltage is applied between the upper and lower electrodes, expands in a direction perpendicular to the direction in which the voltage is applied.

17. The method of claim 10, wherein the plurality of electrode patterns includes a plurality of concentric ring patterns disposed on an upper substrate.

18. The method of claim 10, wherein applying a voltage between an upper electrode and a lower electrode includes applying a plurality of different voltages to the plurality of electrode patterns, respectively.

* * * * *